United States Patent
Lin et al.

(10) Patent No.: US 8,492,967 B2
(45) Date of Patent: Jul. 23, 2013

(54) LIGHT EMITTING DEVICE AND DISPLAY PANEL

(75) Inventors: Chun-Liang Lin, Taipei County (TW); Chun-Hsiang Fang, Yilan County (TW); Chen-Chi Lin, Hsinchu County (TW); Chung-Wei Liu, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 417 days.

(21) Appl. No.: 12/835,747

(22) Filed: Jul. 14, 2010

(65) Prior Publication Data
US 2011/0260953 A1 Oct. 27, 2011

(30) Foreign Application Priority Data
Apr. 22, 2010 (TW) ................................ 99112680 A

(51) Int. Cl.
*H01L 51/00* (2006.01)
(52) U.S. Cl.
USPC ........................................ 313/503; 313/512
(58) Field of Classification Search
USPC .................................. 313/498–512
See application file for complete search history.

(56) References Cited

U.S. PATENT DOCUMENTS

| 7,245,065 B2 | 7/2007 | Ghosh et al. |
| 7,358,663 B2 | 4/2008 | Chen |
| 2008/0093978 A1* | 4/2008 | Mori ............................ 313/498 |
| 2008/0129189 A1 | 6/2008 | Cok |
| 2008/0137206 A1 | 6/2008 | Nakamura et al. |

FOREIGN PATENT DOCUMENTS
CN 1318140 A 10/2001

OTHER PUBLICATIONS

First Office Action of China Counterpart Application, issued on Aug. 19, 2011, p. 1-p. 5, in which the listed reference was cited.

* cited by examiner

*Primary Examiner* — Anne Hines
(74) *Attorney, Agent, or Firm* — Jianq Chyun IP Office

(57) ABSTRACT

A light emitting device includes a substrate, a patterned light-scattering layer, and an electroluminescent device. The patterned light-scattering layer is disposed on a portion of the substrate. The patterned light-scattering layer has a bottom surface in contact with the substrate, a top surface opposite to the bottom surface, and a plurality of sidewalls connecting the bottom surface and the top surface. The electroluminescent device is at least disposed on the sidewalls.

15 Claims, 3 Drawing Sheets

LIGHT EMITTING DEVICE AND DISPLAY PANEL

CROSS-REFERENCE TO RELATED APPLICATION

This application claims the priority benefit of Taiwan application serial no. 99112680, filed on Apr. 22, 2009. The entirety of the above-mentioned patent application is hereby incorporated by reference herein and made a part of this specification.

BACKGROUND OF THE INVENTION

1. Field of the Invention

The invention relates to a light emitting device and a display panel. More particularly, the invention relates to a light emitting device and a display panel which can improve the light emission amount of a device.

2. Description of Related Art

An organic electroluminescent device is a semiconductor device capable of efficiently converting electrical energy into optical energy, and the organic electroluminescent device often serves as a light emitting device of indicator light, a display panel, and an optical pickup head. Since the organic electroluminescent device is characterized by the absence of viewing-angle dependence, simple manufacturing process, low costs, high response speed, wide operating temperature range, and full-color display, the organic electroluminescent device satisfying the requirement for the multi-media display is likely to become a mainstream of the next generation flat panel display.

In general, the organic electroluminescent device includes an anode, an organic light emitting layer, and a cathode. The organic electroluminescent device emits light by injecting holes and electrons into the organic electroluminescent layer respectively through the anode and the cathode. The electrons and the holes are re-combined in the organic electroluminescent layer to form photons, such that light is emitted.

The organic electroluminescent layer and a transparent conductive layer that acts as an electrode are both made of a material having a high refractive index. When the electrons and the holes are re-combined to produce light, parts of the light are refracted to generate incident light having a wide angle. Thereby, total reflection occurs at an interface between the transparent conductive layer and a substrate or at an interface between the substrate and the air, and the light emission amount is insufficient because the light is not able to be transmitted out.

SUMMARY OF THE INVENTION

The invention is directed to a light emitting device capable of increasing light emission amount of a device.

The invention is further directed to a light emitting device capable of reducing total reflection of light in a device.

The invention is further directed to a display panel having a relatively large amount of light emission.

In the invention, a light emitting device including a substrate, a patterned light-scattering layer, and an electroluminescent device is provided. The patterned light-scattering layer is disposed on a portion of the substrate. The patterned light-scattering layer has a bottom surface in contact with the substrate, a top surface opposite to the bottom surface, and a plurality of sidewalls connecting the bottom surface and the top surface. The electroluminescent device is at least disposed on the sidewalls.

According to an embodiment of the invention, the patterned light-scattering layer is made of transparent photoresist having a low refractive index and a scattering material having a high refractive index or made of transparent photoresist having a high refractive index and a scattering material having a low refractive index, for example.

According to an embodiment of the invention, an included angle formed between the bottom surface and each of the sidewalls is an acute angle, for example.

According to an embodiment of the invention, the acute angle ranges from about 5° to about 65°, for example.

According to an embodiment of the invention, an area of the top surface is smaller than an area of the bottom surface, for example.

According to an embodiment of the invention, a thickness of the patterned light-scattering layer ranges from 0.1 to 30 times a thickness of the organic electroluminescent device, for example.

According to an embodiment of the invention, the patterned light-scattering layer is a meshed patterned light-scattering layer, for example.

According to an embodiment of the invention, the patterned light-scattering layer includes a plurality of stripe patterned light-scattering layers, for example.

According to an embodiment of the invention, a haze of the patterned light-scattering layer is greater than 10, for example.

According to an embodiment of the invention, the electroluminescent device includes a first electrode layer, an organic electroluminescent stacked layer, and a second electrode layer. The first electrode layer is disposed on the top surface, the sidewalls, and the substrate that is not covered by the patterned light-scattering layer. The organic electroluminescent stacked layer is disposed on the first electrode layer. The second electrode layer is disposed on the organic electroluminescent stacked layer.

According to an embodiment of the invention, the electroluminescent device can be further disposed on the top surface and the substrate that is not covered by the patterned light-scattering layer.

In the invention, another light emitting device including a substrate, a patterned light-scattering layer, and an electroluminescent device is provided. The patterned light-scattering layer is disposed on a portion of the substrate. The patterned light-scattering layer has a bottom surface, a top surface opposite to the bottom surface, and a plurality of sidewalls connecting the bottom surface and the top surface. An included angle formed between the bottom surface and each of the sidewalls is an acute angle. The electroluminescent device is disposed on the patterned light-scattering layer.

In the invention, a display panel including a substrate, a patterned light-scattering layer, an electroluminescent device, and at least a switching device is provided. The patterned light-scattering layer is disposed on a portion of the substrate. The patterned light-scattering layer has a bottom surface, a top surface opposite to the bottom surface, and a plurality of sidewalls connecting the bottom surface and the top surface. The electroluminescent device is at least disposed on the sidewalls. The switching device is electrically connected to the electroluminescent device.

Based on the above, the patterned light-scattering layer is disposed on the substrate, and the electroluminescent device is disposed on the patterned light-scattering layer according to this invention, such that the light emitted from the electroluminescent device can be scattered when the light passes through the patterned light-scattering layer. The scattered light can enter the substrate at different angles, so as to reduce total reflection and increase the amount of light emission.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
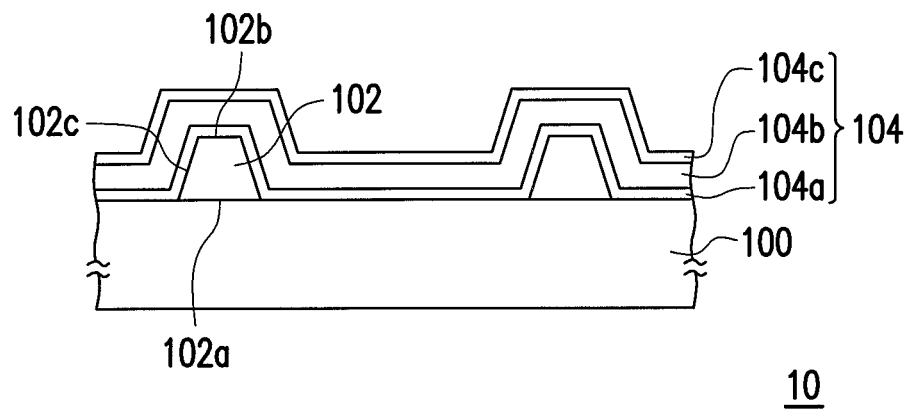
FIG. 1 is a schematic cross-sectional view illustrating a light emitting device according to an embodiment of the invention.
Figure 2:
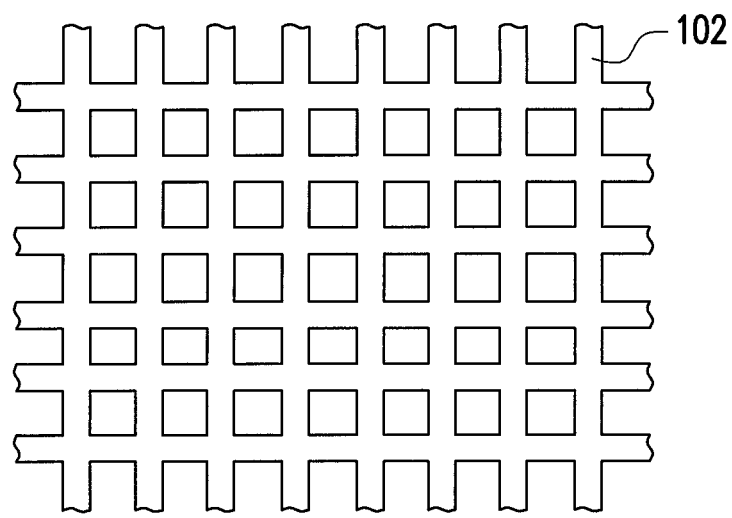
FIG. 2 is a schematic top view illustrating a patterned light-scattering layer according to an embodiment of the present invention.

FIG. 1 is a schematic cross-sectional view illustrating a light emitting device according to an embodiment of the invention. As shown in FIG. 1, a light emitting device 10 of this embodiment includes a substrate 100, a patterned light-scattering layer 102, and an electroluminescent device 104. The electroluminescent device 104 is organic or inorganic electroluminescent device, for example. The substrate 100 is a transparent substrate (e.g. a glass substrate). The patterned light-scattering layer 102 is disposed on a portion of the substrate 100, for instance. The patterned light-scattering layer 102 has a bottom surface 102a in contact with the substrate 100, a top surface 102b opposite to the bottom surface 102a, and sidewalls 102c connecting the bottom surface 102a and the top surface 102b. An included angle formed between each of the sidewalls 102c and the bottom surface 102a is an acute angle ranging from about 5° to about 65°, for example. In addition, an area of the top surface 102b is smaller than an area of the bottom surface 102a, for instance. Namely, the cross-section of the patterned light-scattering layer 102 has a trapezoid shape. The patterned light-scattering layer 102, for example, is made of transparent photoresist having first refractive index which is a low refractive index and a scattering material (e.g. $TiO_2$, $ZrO_2$, and so on) having a second refractive index which is a high refractive index. The first refractive index is different from the second refractive index. The second refractive index is higher than the first refractive index. In an alternative, the patterned light-scattering layer 102 can be made of transparent photoresist having first refractive index which is a high refractive index and a scattering material (e.g. $SiO_2$, $MgF_2$, and so on) having second refractive index which is a low refractive index. The first refractive index is different from the second refractive index. The first refractive index is higher than the second refractive index. A haze of the patterned light-scattering layer 102 is greater than about 10, for example. The patterned light-scattering layer 102 scatters light. In an embodiment, a top view of the patterned light-scattering layer 102 shows that the patterned light-scattering layer 102 has meshed patterns, as illustrated in FIG. 2. Undoubtedly, in other embodiments, the patterned light-scattering layer 102 can also include a plurality of stripe patterned light-scattering layers, a plurality of circular patterned light-scattering layers, a plurality of square patterned light-scattering layers, a plurality of triangular patterned light-scattering layers, or a plurality of polygonal patterned light-scattering layers.

Besides, according to this embodiment, the electroluminescent device 104 is disposed on the top surface 102b, the sidewalls 102c, and the substrate 100 that is not covered by the patterned light-scattering layer 102. To be more specific, the electroluminescent device 104 includes an electrode layer 104a, an electroluminescent stacked layer 104b, and an electrode layer 104c. The organic electroluminescent stacked layer 104b may be an organic electroluminescent stacked layer or an inorganic electroluminescent stacked layer. The electrode layer 104a is disposed on the top surface 102b, the sidewalls 102c, and the substrate 100 that is not covered by the patterned light-scattering layer 102. A material of the electrode layer 104a is transparent conductive oxide (TCO) which can be indium tin oxide (ITO), aluminum doped ZnO (AZO), indium zinc oxide (IZO), or any other transparent conductive material. The electroluminescent stacked layer 104b is disposed on the electrode layer 104a. Here, the electroluminescent stacked layer 104b can be formed by a hole injecting layer (HIL), a hole transporting layer (HTL), an organic light emitting layer (EML), an electron transporting layer (ETL), an electron injecting layer (EIL), and a hole blocking layer (HBL), for example. Materials and arrangement of the HIL, the HTL, the organic EML, the ETL, the EIL, and the HBL are well known to people having ordinary skill in the art, and therefore no further description is provided herein. Besides, people having ordinary skill in the art can selectively use the HIL, the HTL, the ETL, the EIL, and the HBL based on actual requirements. The electrode layer 104c is disposed on the electroluminescent stacked layer 104b. Here, the electrode layer 104c is made of metal, for example.

According to this embodiment, a thickness of the patterned light-scattering layer 102 ranges from about 0.1 to 30 times a thickness of the electroluminescent device 104, for example. The thickness of the patterned light-scattering layer 102 ranges from about 0.02 μm to 10 μm, for example.

Additionally, based on design demands, the electroluminescent device 104 can be at least disposed on the sidewalls 102c according to this embodiment.

The light emitting device 10 is taken as an example to describe effects generated by the patterned light-scattering layer 102.

Figure 3A:
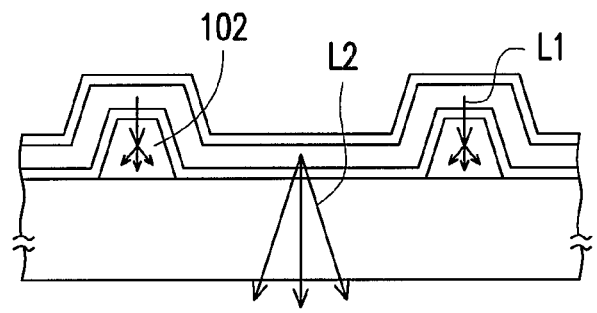
FIG. 3A, FIG. 3B, and FIG. 3C respectively illustrating a transmission path of light which is generated by an organic electroluminescent device.
Figure 3B:
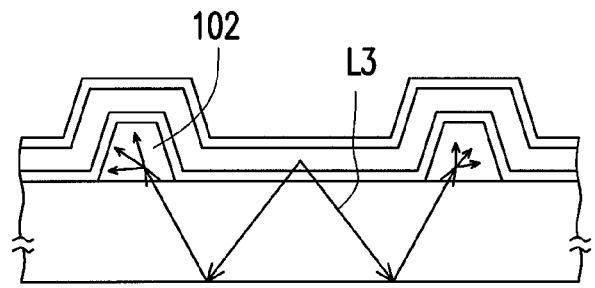
Figure 3C:
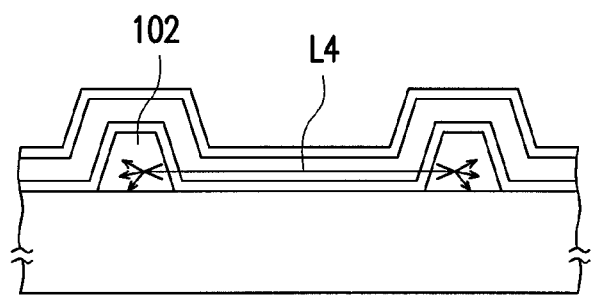

FIG. 3A, FIG. 3B, and FIG. 3C respectively illustrating a transmission path of light which is generated by an electroluminescent device. With reference to FIG. 3A, when the light L1 generated by re-combining electrons and holes enters the patterned light-scattering layer 102, the light L1 is scattered, such that the scattered light L1 enters the substrate 100 at different angles. Thereby, the light L1 is more likely to be transmitted out of the substrate 100, and the amount of light emission can be increased. By contrast, the light L2 is not affected and can still be directly transmitted out of the substrate 100.

With reference to FIG. 3B, when the light L3 generated by re-combining electrons and holes enters the substrate 100, is totally reflected, and then enters the patterned light-scattering layer 102, the light L3 is scattered, such that the scattered light L3 re-enters the substrate 100 at different angles. Thereby, the light L3 is more likely to be transmitted out of the substrate 100, and the amount of light emission can be increased.

With reference to FIG. 3C, when the light L4 generated by re-combining electrons and holes is within the patterned light-scattering layer 102, horizontal light that does not enter the substrate 100 can be scattered after the horizontal light passes through the patterned light-scattering layer 102, such that the scattered light can enter the substrate 100. Thereby, the light scattered by the patterned light-scattering layer 102 is more likely to be transmitted out of the substrate 100, and the amount of light emission can be increased.

Note that the light emitting device of the invention is applicable to a display panel. The light emitting device 10 is taken as an example to describe the display panel.

Figure 4:
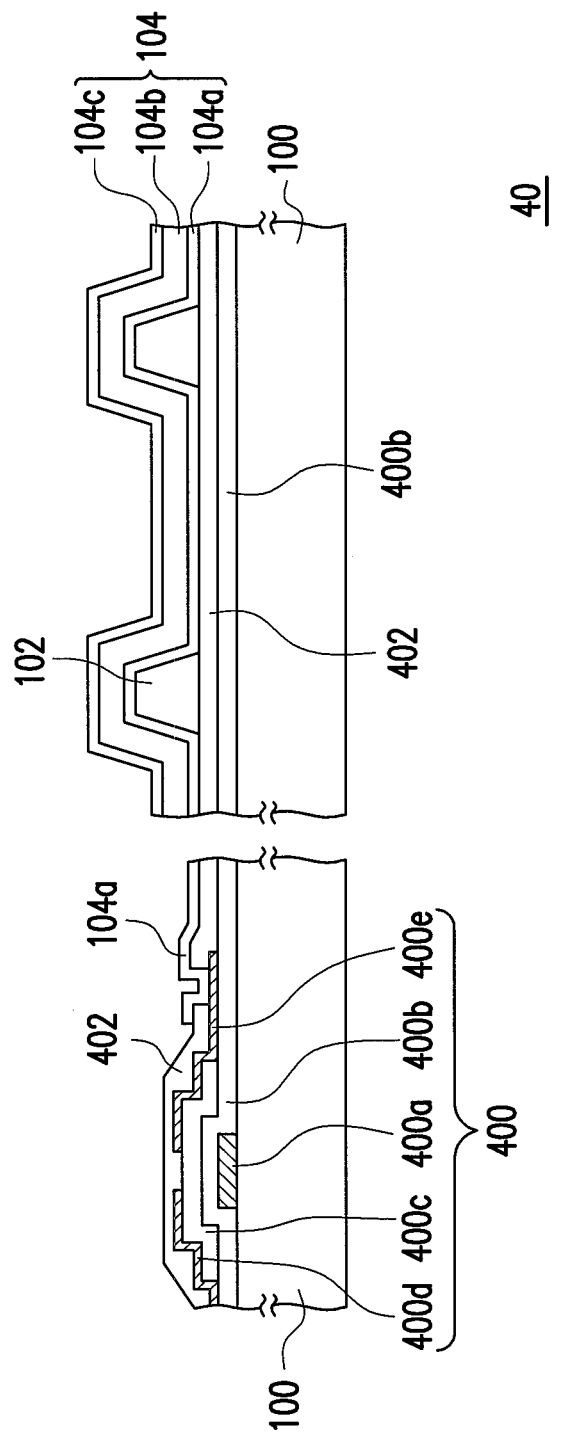
FIG. 4 is a schematic cross-sectional view illustrating a display panel according to an embodiment of the invention.

FIG. 4 is a schematic cross-sectional view illustrating a display panel according to an embodiment of the invention. As indicated in FIG. 4, the display panel 40 includes the light emitting device 10 as shown in the above embodiment(s) and a switching device 400. The switching device 400 is electrically connected to the electroluminescent device 104. Here, the switching device 400 is a thin film transistor (TFT), for instance. In this embodiment, only one switching device 400 is depicted for the purpose of explanation, while one or more switching devices 400 can be disposed in the display panel 40 according to other embodiments.

The switching device 400 includes a gate 400a, a gate insulating layer 400b, a channel layer 400c, a source 400d, and a drain 400e. Arrangement and materials of said components are well known to people having ordinary skill in the art, and therefore no further description is provided herein. A passivation layer 402 covers the switching device 400 but exposes a portion of the drain 400e. The electroluminescent device 104 and the patterned light-scattering layer 102 are located on the passivation layer 402, and the electrode layer 104a of the electroluminescent device 104 extends to the drain 400e exposed by the passivation layer 402, such that the electroluminescent device 104 and the switching device 400 are electrically connected to each other.

In light of the foregoing, the patterned light-scattering layer is disposed on the substrate, and the electroluminescent device is disposed at least on the sidewalls of the patterned light-scattering layer according to this invention, such that the light emitted from the electroluminescent device can be scattered when the light passes through the patterned light-scattering layer. The scattered light enters the substrate at different angles, so as to reduce total reflection and increase the amount of light emission.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A light emitting device comprising:
    a substrate;
    a patterned light-scattering layer disposed on a portion of the substrate, wherein the patterned light-scattering layer has a bottom surface in contact with the substrate, a top surface opposite to the bottom surface and a plurality of sidewalls connecting the bottom surface and the top surface; and
    an electroluminescent device at least disposed on the sidewalls of the patterned light-scattering layer, wherein the electroluminescent device comprises:
        a first electrode layer disposed on the top surface and the sidewalls of the patterned light-scattering layer;
        an organic electroluminescent stacked layer disposed on the first electrode layer; and
        a second electrode layer disposed on the organic electroluminescent stacked layer.

2. The light emitting device as claimed in claim 1, wherein the patterned light-scattering layer is comprised of:
    a transparent photoresist having a first refractive index; and
    a scattering material having a second refractive index, wherein the first refractive index is different from the second refractive index.

3. The light emitting device as claimed in claim 2, wherein the first refractive index is higher than the second refractive index.

4. The light emitting device as claimed in claim 2, wherein the second refractive index is higher than the first refractive index.

5. The light emitting device as claimed in claim 1, wherein the bottom surface and one of the sidewalls form an included angle which is an acute angle.

6. The light emitting device as claimed in claim 5, wherein the acute angle ranges from about 5° to about 65°.

7. The light emitting device as claimed in claim 1, wherein a haze of the patterned light-scattering layer is greater than 10%.

8. The light emitting device as claimed in claim 1, wherein a thickness of the patterned light-scattering layer ranges from 0.1 to 30 times a thickness of the electroluminescent device.

9. The light emitting device as claimed in claim 1, wherein the patterned light-scattering layer is a meshed patterned light-scattering layer.

10. The light emitting device as claimed in claim 1, wherein the patterned light-scattering layer comprises a plurality of stripe patterned light-scattering layers.

11. The light emitting device as claimed in claim 1, wherein an area of the top surface is smaller than an area of the bottom surface.

12. The light emitting device as claimed in claim 11, wherein
    the first electrode layer is further disposed on a portion of the substrate which is not covered by the patterned light-scattering layer.

13. The light emitting device as claimed in claim 1, wherein the acute angle ranges from about 5° to about 65°.

14. A display panel comprising:
    a substrate;
    a patterned light-scattering layer disposed on a portion of the substrate, wherein the patterned light-scattering layer has a bottom surface, a top surface opposite to the bottom surface and a plurality of sidewalls connecting the bottom surface;
    an electroluminescent device at least disposed on the sidewalls, wherein the electroluminescent device comprises:
        a first electrode layer disposed on the top surface and the sidewalls of the patterned light-scattering layer;
        an organic electroluminescent stacked layer disposed on the first electrode layer; and
        a second electrode layer disposed on the organic electroluminescent stacked layer; and
    at least a switching device electrically connected to the electroluminescent device.

15. The light emitting device as claimed in claim 14, wherein the first electrode layer is further disposed on a portion of the substrate which is not covered by the patterned light-scattering layer.

* * * * *